United States Patent [19]

Berenguel et al.

[11] Patent Number: 5,241,508
[45] Date of Patent: Aug. 31, 1993

[54] NONVOLATILE RAMDISK MEMORY

[75] Inventors: Leo P. Berenguel, Fremont; John Reykjalin, Berkeley, both of Calif.

[73] Assignee: Peripheral Land, Inc., Fremont, Calif.

[21] Appl. No.: 679,612

[22] Filed: Apr. 3, 1991

[51] Int. Cl.$^5$ .............................................. G11C 11/40
[52] U.S. Cl. ........................................ 365/229; 307/66
[58] Field of Search ................. 365/229; 307/66, 64; 371/14, 66

[56] References Cited

U.S. PATENT DOCUMENTS

| | | | |
|---|---|---|---|
| 4,323,987 | 4/1982 | Holtz et al. | 371/66 X |
| 4,712,195 | 12/1987 | Finger | 365/229 X |
| 4,763,333 | 8/1988 | Byrd | 365/228 X |
| 4,959,774 | 9/1990 | Davis | 365/228 X |
| 4,965,828 | 10/1990 | Ergott, Jr. et al. | 307/64 X |

FOREIGN PATENT DOCUMENTS 187369 7/1986 European Pat. Off. ............ 365/229

Primary Examiner—James B. Mullins
Attorney, Agent, or Firm—Robert Charles Hill

[57] ABSTRACT

A nonvolatile memory system for a host computer system including a nonvolatile memory and a volatile random access memory that is chosen because of its short access time. When main power to the host system and RAMDISK is interrupted, data stored in the volatile memory is automatically transferred to the nonvolatile memory where it is stored until power is restored. When main power is restored, the data is automatically returned to the volatile memory. The RAMDISK memory features a power monitoring circuit that detects when main power is interrupted and switches the system onto a battery backup power source in order to power the RAMDISK while data transfer takes place. After power has been restored, the backup battery is recharged automatically by the monitoring circuit.

9 Claims, 4 Drawing Sheets

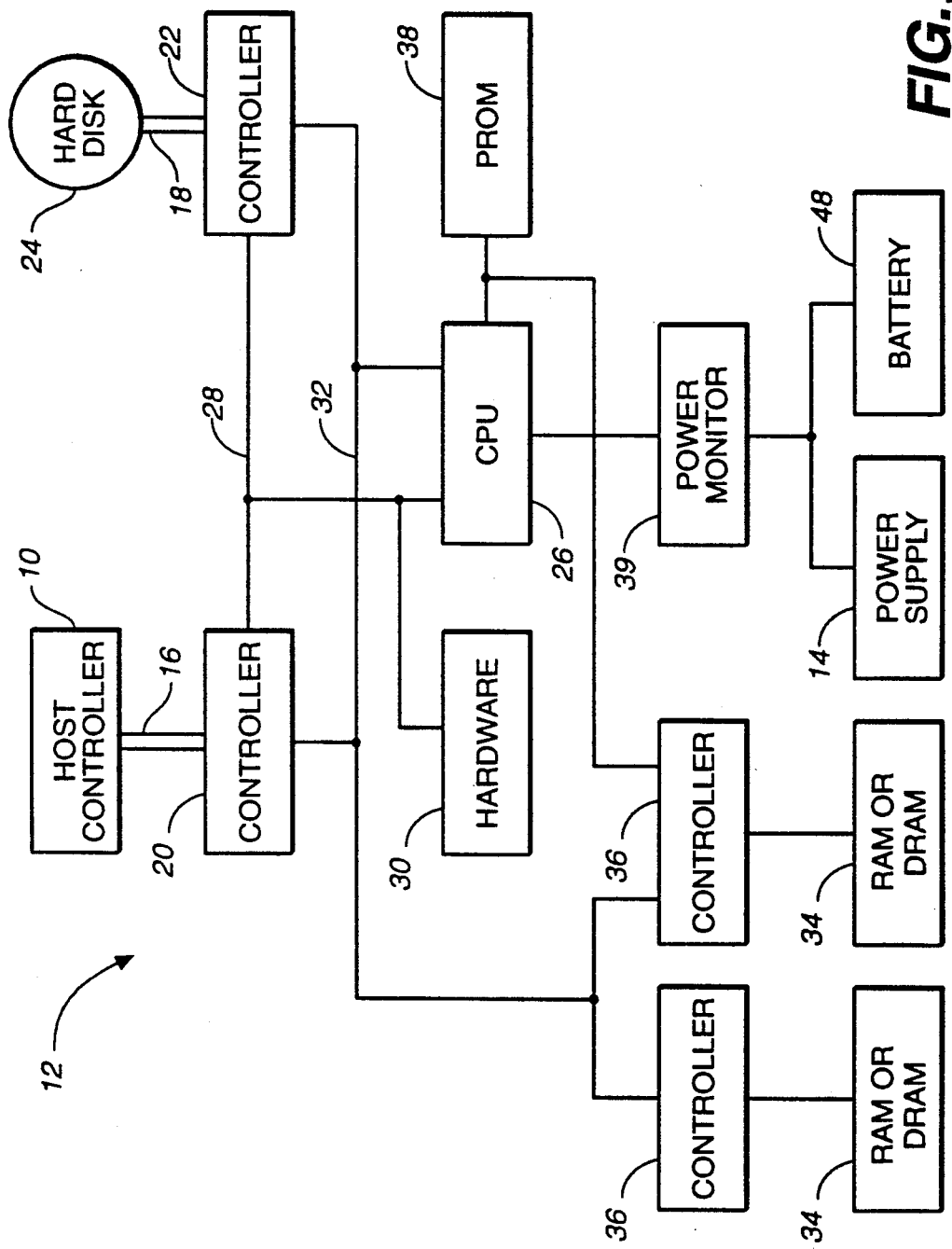
FIG._1

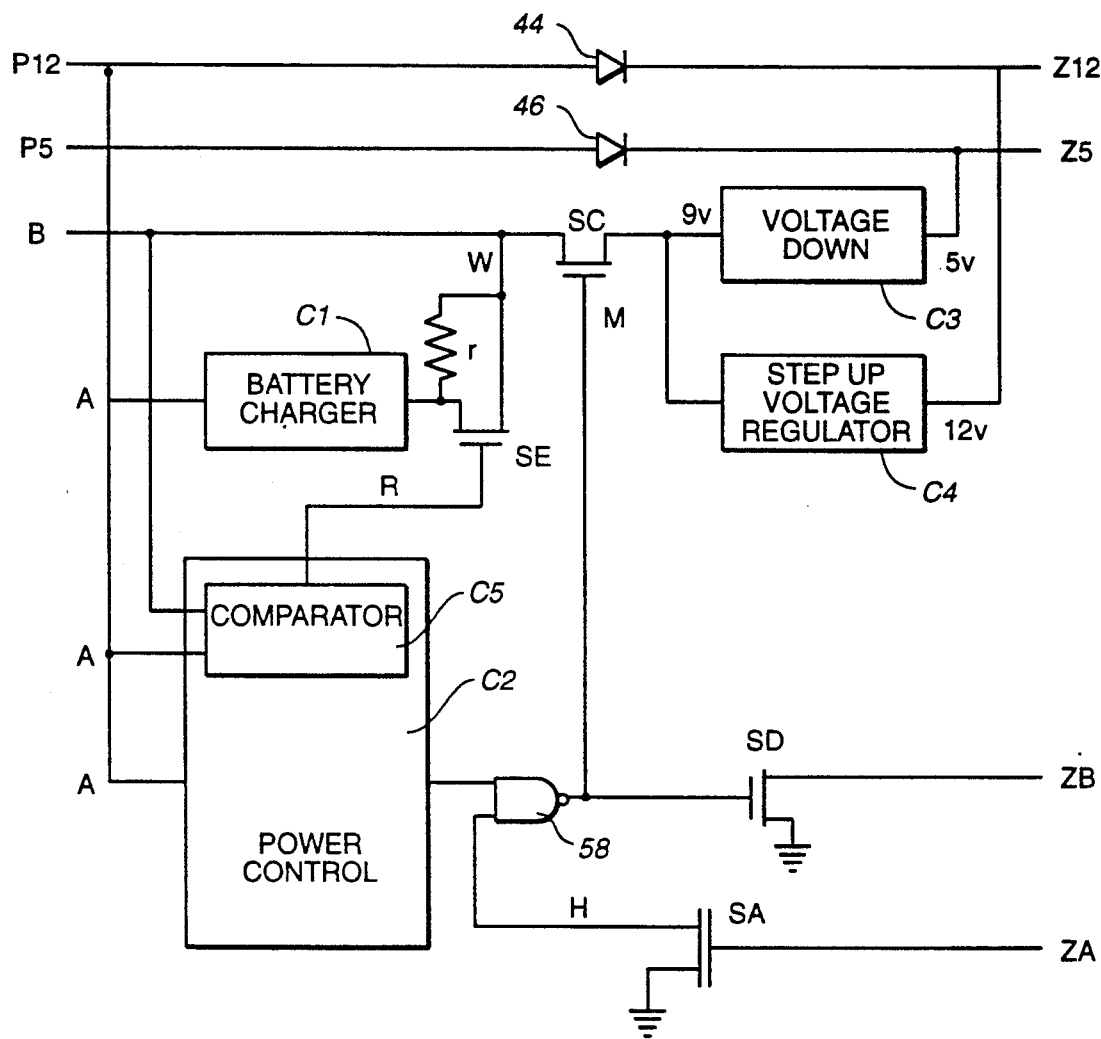
FIG._2

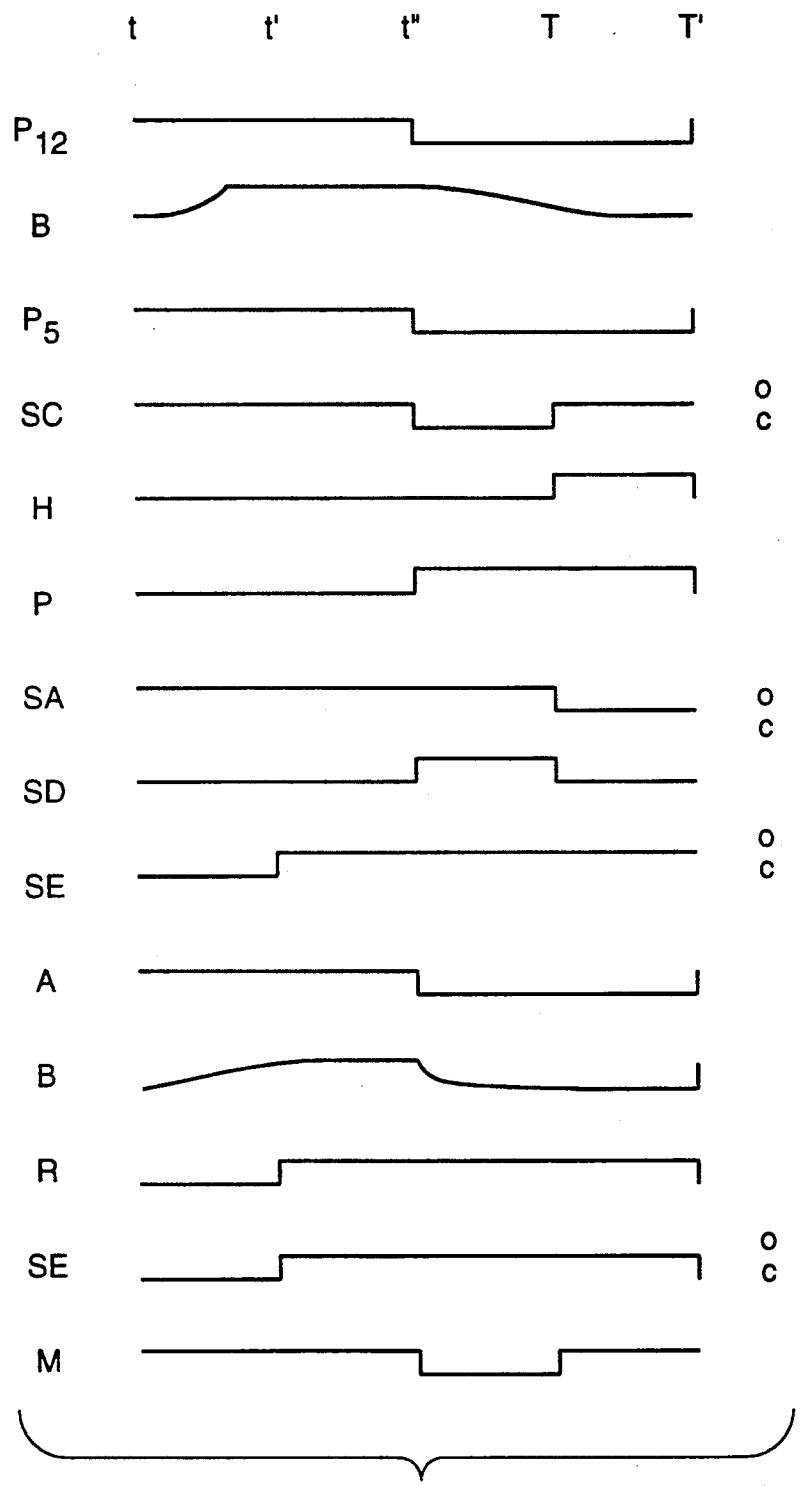
FIG._3

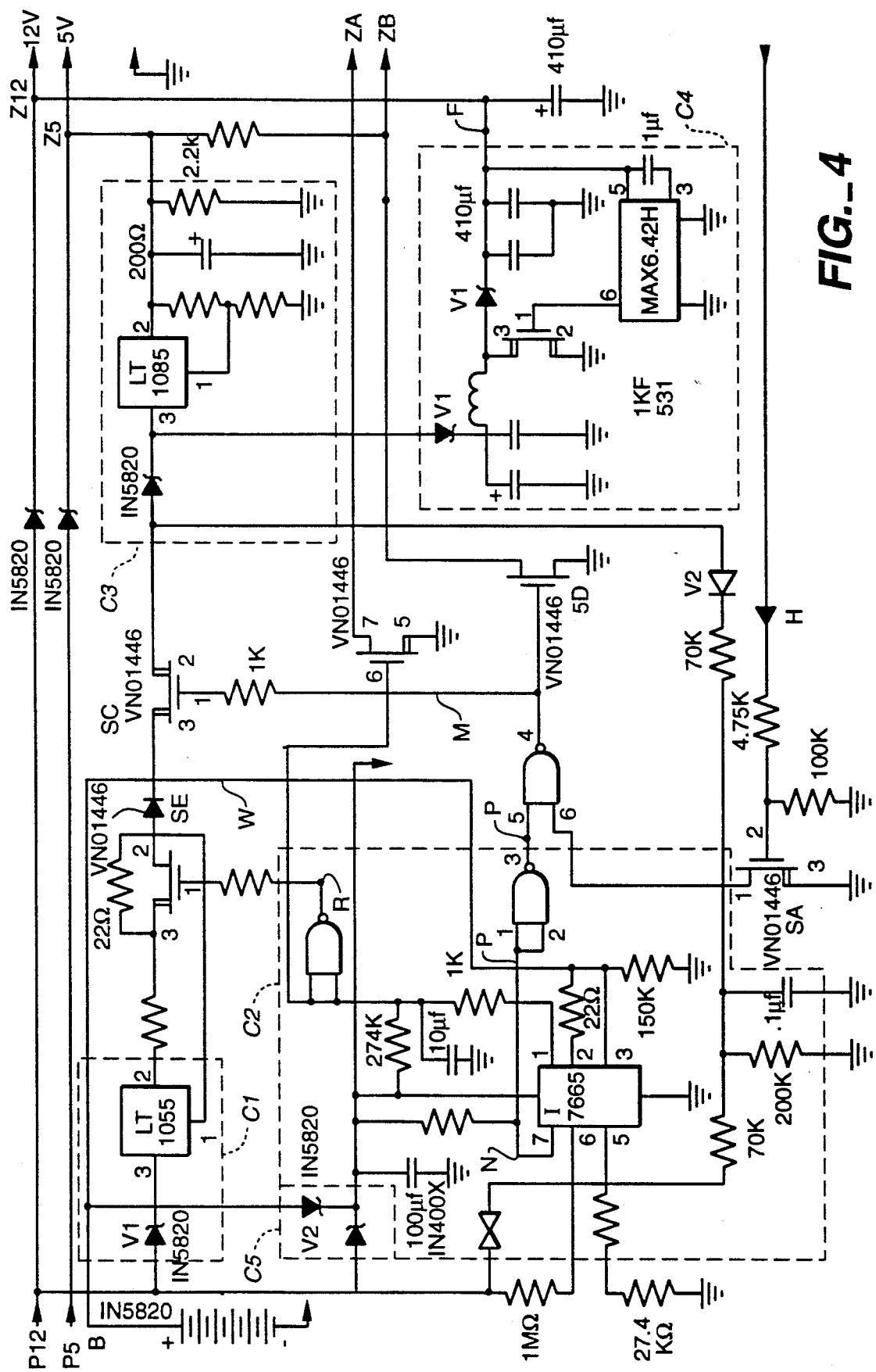
FIG._4

NONVOLATILE RAMDISK MEMORY

FIELD OF THE INVENTION

This invention relates to a memory for computers and particularly to a combination semiconductor-disk memory that features the speed of a semiconductor memory yet retains contents of the memory when power is discontinued for any reason.

BACKGROUND AND INFORMATION DISCLOSURE

Computers generally use a combination of a memory based on semiconductor technology (a RAM) with a disk memory based on magnetic recording technology. The RAM features greatest speed for accessing and the magnetic memory features large volume. The problem with the RAM is that it is a volatile memory, i.e., when the computer is turned off either purposely or when a power failure occurs, the contents of the RAM are destroyed, whereas the contents of a magnetic memory are not lost when power is discontinued. Consequently, if it is desired to save data stored in RAM based storage unit when power is shut off, then the operator must intentionally first transfer the data to a disk based storage unit. Sometimes, the operator forgets to make the transfer. Furthermore, transfer of each file from RAM to disk can be tedious if there are a large number of files to be transferred individually.

The procedure of intentional transfer of data from RAM based storage unit to disk based storage unit can not be applied when the power is interrupted inadvertently, e.g., when a power failure occurs. In this case, data stored in RAM based storage unit is lost. In order to resolve the problem of data loss due to inadvertent power failure, a number of devices (circuit packages) have appeared on the market which detect an inadvertent power failure and immediately switch on a battery supply that can sustain the system for several hours until power is restored. The problem with this arrangement is that a power failure can occur when the computer is unattended—such as in the middle of the night or on a weekend—or the cause of the power failure may be such that power is unavailable for an extended period. The result of these situations is that the battery will run down.

THE INVENTION

Objects

It is an object of this invention to prevent the loss of data stored in a SCSI RAM based storage unit when an inadvertent interruption of power to the storage unit occurs.

It is another object that the operator be relieved of the necessity to load and unload data between RAM based storage unit and disk based storage unit when it is desired to shut off or start up the computer.

It is another object to require a smaller-sized backup battery to protect against data loss due to power shut down than required by systems of the prior art.

It is another object to relieve the operator from the responsibility of having to unload data from RAM based storage unit to DISK based storage unit when he wishes to turn off power and load data from DISK based storage unit to RAM based storage unit when he applies power to the system.

Summary

This invention is directed toward a method and circuit (apparatus) which connects a volatile high-speed RAM memory to a host computing system via the SCSI interface when the system is operating but automatically stored the contents of the RAM memory onto a disk memory for nonvolatile storage in the event of a power failure to the system. After power is restored, contents of the disk memory are automatically returned to the RAM memory.

The circuit includes a power detector-microprocessor combination, backed up by a battery power supply and connected to a source of main power. The microprocessor is connected to a pair of SCSI controllers. (SCSI is an abbreviation of "Standard Control System Interface".) These SCSI controllers direct exchange of data between the host system and a bank of RAM (random access memory) devices when main power is available. When main power is interrupted, the power detector connects battery power to the RAM bank and DISK, and signals the microcomputer to connect the RAM devices to the DISK memory through the SCSI controllers. The battery powers the RAM bank and DISK until all of the contents in RAM have been transferred to DISK. When power is restored, the contents on disk are re-entered into RAM through the SCSI controllers and normal operation between the host and RAM continues.

DRAWINGS

FIG. 1 is a block diagram of the nonvolatile RAM-DISK memory system.

FIG. 2 is a block diagram of the power monitor circuit.

FIG. 3 is a timing diagram showing voltages of key points and switch conditions of the circuit of FIG. 2.

FIG. 4 shows in detail one embodiment of the power monitoring circuit of FIG. 2.

DESCRIPTION OF THE PREFERRED EMBODIMENT

The following detailed description illustrates the invention by way of example and not by way of limitation of the principles of the invention. This description will clearly enable one skilled in the art to make and use the invention and suggests several embodiments, adaptations, and variations.

In FIG. 1 is shown a computer system including a host computer 10 which uses for data storage the nonvolatile SCSI RAMDISK memory system generally indicated by 12.

The RAMDISK memory system includes two separate and independent SCSI channels, 16 and 18, connected respectively to two SCSI controllers, 20 and 22, a CPU 26, bulk volatile memory (RAM) 34, a Winchester hard disk 24, memory windowing hardware 30, and a power supply 14 backed by battery 48.

The first SCSI channel 16 is connected to the host system 10 and to VLSI SCSI controller device 20. This controller device 20 is operated in target mode. A SCSI controller in the host system 10 provides commands for the RAMDISK device and is the initiator on the first SCSI channel which is connected to the RAMDISK by I/O bus 28.

The RAM basic storage unit is a volatile memory for the host system, and is shown in FIG. 1 as two "dynamic random access memories" (DRAM) 34. Each DRAM 34 comprises 32 Mbyte by 16 bits. Two banks of DRAM 34 have associated DRAM controller devices 36 which translate the address and read/write requests from the CPU 26 via a direct memory access (DMA) channel 32 into the appropriate timing and control signals for the DRAM array 34.

The DRAM controllers 36 also provide memory refreshing of the DRAM units 34 as required. Although FIG. 1 shows only two DRAM units, it should be understood that additional 64 or 32×2 Mbyte storage modules may be added, each with its own DRAM controller device.

The second SCSI channel 18 is connected to the Winchester hard disk 24, and is controlled by VLSI SCSI controller device 22 which operates an initiator mode.

When Winchester backup disk 24 is required to provide nonvolatile storage to prevent loss of information in the event of a power failure or when the system is turned off, information is transferred to and from the disk via second SCSI Channel 18 through direct memory access (DMA) channel 32 which connects SCSI controller 22 and the bulk RAM memory units 34.

The CPU 26 controls the operation of the RAMDISK memory by responding to commands from the host system via the SCSI controller 20. The CPU 26 controls and sets parameters of the SCSI controllers 20 and 22 to which it is connected by I/O bus 28. The CPU 26 forms a microcomputer in association with peripheral devices including a "read only memory" (PROM) 38, data storage (RAM, now shown) and I/O decoder (not shown). The instructions for the CPU 26 are contained in PROM 38. The data storage for the microcomputer is in a static RAM (not shown) and separate from bulk RAM 34. The CPU 26 also features an interrupt controller, counter/timers, DMA channels, and I/O decoder (all of which are part of CPU 26 and therefore not shown separately from the CPU 26).

The components performing the functions shown in FIG. 1 can be selected from a large number of CPU's, DRAMS, controllers, etc. that are available from different companies in the marketplace. Details in the construction of the RAMDISK will depend on the particular set of components that is selected and all of these various constructions will fall within the scope of the invention.

For example, the circuit shown in the block diagram of FIG. 1 may be constructed using an NCR chip 53694 in the SCSI controller, and 8422A for the DRAM controller, an NEC50 for the CPU, etc.

A block diagram of the power monitor circuit 39 is shown in FIG. 2.

The power monitor circuit 39 monitors power provided from two sources. During normal operation, power is derived from the normal wall outlet through a power supply 14. When the voltage level from the mainsupply drops due to a power failure or on power down of the RAM DISK system, the monitoring circuitry 39 switches the power source from the power supply 14 (connected to the wall outlet) to one or more backup batteries 48. These batteries enable the contents of the RAM 34 to be transferred to the hard DISK 24 via the second SCSI channel 18.

Various connector points in FIG. 2 are indicated by symbols A,B,H,M,R,$P_{12}$,$Z_5$, and $Z_{12}$. The voltages of these points as a function of time indicate various steps in the operation of the circuit.

FIG. 3 is a timing diagram that indicates the voltages represented by the symbols and conditions of the switches SA, SC, SD, and SE throughout the operating period of the circuit.

Referring to FIG. 2, and as shown by top lines $P_{12}$ and $P_5$ during the period from t to t'', 12 volts and 5 volts are applied directly to input terminals $Z_{12}$ and $Z_5$ of the CPU 26 through schottky diodes 44 and 46 respectively. The battery 48 is charging from t until an instant t', after which the battery 48 is fully charged. At time t'', the power at $P_{12}$ and $P_5$ is interrupted either intentionally because the operator has turned wall power off, or because a failure of wall power has occurred. During the period from t'' to T, the battery power is switched on and the data stored in the volatile RAM 34 is transferred to the nonvolatile DISK 24. At time T, transfer of data has been completed and the battery is disconnected until main power is restored at time T.

Sections C1–C5 of power monitor circuit 39 shown in FIG. 2 perform specific functions related to the power monitoring requirement.

These functions are described as follows:

Switch SC is closed when the voltage at control point M is low during the time period t''–T. M is the output of logic NAND 58. Input to NAND is P, the inverse of the signal at A, and the "end of data" signal at H.

When main power is off during t''–T current passes from the battery directly through switch SC, then branches through sections C3 and C4 thereby supplying power to the RAMDISK terminals $Z_5$ and $Z_{12}$ respectively so that data in RAM can be stored in DISK.

C3 is a voltage step-down circuit that reduces battery voltage (generally 9 volts) to 5 volts outputs at $Z_5$.

C4 is a step-up voltage regulator that maintains constant 12 volts at $Z_{12}$ during t''–T.

Section C1 is the battery charging section and passes current through line W during t–t' when the battery is being charged, and passes a trickle current to the battery through line W to maintain the charge during the period t'–t''. This is accomplished as described in the following paragraphs:

Section C2 performs several power control functions and is described as follows:

C2 has a comparator section C5 which compares the voltage on the main power line at A to the battery voltage at B. Since the battery voltage will be lower than its fully charged value at time t until time t', the signal at R will be low during t–t' thereby closing switch SE and bypassing "trickle" resistor, r. When the battery has becomes fully charged at time t', comparator C5 detects this condition so that the signal at R will go high and open switch SE. Charging current must now pass through resistor, r, and is thereby reduced to a trickle to maintain the battery during long periods when the main power is on.

Line ZA connects section C2 to the microcomputer and goes high at time t'' to signal the microcomputer to transfer data from RAM to DISK. Line ZB connects section C2 to the microcomputer and goes high at time T to indicate that the battery has been completely charged.

In summary, the schematic diagram shown in FIG. 2 represents an arrangement of sections of the power monitoring circuit wherein each section performs specific parts of the operations as described in the foregoing paragraphs. There are a number of ways well known in the art by which each of these sections can be constructed, all of which are within the scope of the invention. For example, FIG. 4 is a detailed circuit diagram of one version of the power monitor circuit shown in FIG. 2, in which sections have been enclosed and labelled corresponding to the labelled sections of FIG. 2.

It may also be recognized that the power monitoring circuit shown in FIG. 2 can be useful in any operation using a main source of power where it is required to connect onto a backup power source—such as a battery—in order to execute a procedure in the event of a main power failure and then to recharge the battery after main power has been restored.

In the foregoing paragraphs, an embodiment has been described which meets the objects of the invention. A major feature of the invention is the power monitor circuit which detects when main power of the computer system fails and immediately switches on battery power which powers the RAMDISK memory long enough to transfer data from the volatile RAM memory to the nonvolatile DISK memory. After power is restored, the data is returned from the DISK to the RAM and the power monitor circuit recharges the battery. The invention thereby provides that main power can be interrupted for an indefinitely long period of time, and the data will always be saved regardless of the number of times that the power is interrupted.

While I presently believe that the circuit described in the foregoing paragraphs is the best mode of carrying out the invention, modifications of the circuits may be introduced which still represent the essence of the invention and therefore fall within the scope of the invention. For example, a nonvolatile magnetic core memory could be used in place of the DISK memory. I therefore wish the scope of my invention to be defined by the appended claims and in view of the specification if need be.

I claim:

1. A memory system connectable to a host computer system operated with power from a main power source which comprises:
   a volatile memory means for storing data which loses said data when said power is interrupted;
   a nonvolatile memory means for storing said data and which retains said data when power is interrupted;
   means connected to said host system and said volatile memory means for transmitting said data between said host computer system and said volatile memory means;
   means connected to said volatile memory means and to said nonvolatile memory means for transferring said data between said volatile memory means and said nonvolatile memory means;
   means connected to said transferring means and to said transmitting means for directing said transmitting means to transmit data between said volatile memory and said host system and directing said transferring means to transfer data between said volatile and said nonvolatile memory means;
   a means connected to said directing means for monitoring power from said main power source providing that, when said main power is interrupted, said memory system is connected to a backup power source and said directing means directs said transfer means to transfer data from said volatile memory means to said nonvolatile memory means and, when main power is restored, said directing means directs said transfer means to transfer said data from said nonvolatile memory to said volatile memory;
   said directing means having a signal terminal indicating end of data;
   said monitoring means comprising;
   an output terminal means attachable to said directing means;
   a main power terminal means attachable to said main source of power;
   a means for rectifying having one terminal connected to said main power terminal means and another terminal connected to said output terminal means, thereby permitting current to flow from said main power terminal means to said directing means, but preventing current from flowing from said directing means to said main power terminal means;
   a backup power terminal means connectable to a source for supplying backup power;
   a backup power switch having a first terminal connected to said backup power terminal means, a second terminal connected to said output terminal means and a control terminal for controlling said switch;
   a logic NAND circuit having an output terminal connected to said control terminal, a first input terminal connected to said terminal indicating end of data, and a second input terminal;
   a connection between said second input NAND terminal and a terminal in said directing means;
   a means for detecting interruption of main power having an input terminal connected to said main power terminal, and an interrupt signal terminal connected to said second input NAND terminal;
   a means for charging said backup power source having an input terminal connected to said main power terminal means, an output charging terminal connected to said backup power terminal means, and a charging control terminal; and
   a means for comparing two voltages having a first compare terminal connected to said main power terminal means, a second compare terminal connected to said backup power terminal means, and a signal terminal connected to said charging control terminal, thereby providing that when voltage from said backup power source is less than a full charge voltage signal proportional to said main power, a signal on said signal terminal will cause said charging means to pass charging current from said main power terminal means to said backup power terminal means.

2. A memory system as in claim 1 wherein said nonvolatile memory comprises a memory disk.

3. A memory system as in claim 1 wherein said volatile memory comprises:
   a DRAM memory
   a DRAM controller connected to said DRAM memory.

4. A memory system as in claim 1 wherein said data transmitting means comprises:
   a first SCSI bus having an end connectable to said host system;
   a first SCSI controller connected to another end of said first SCSI bus, and to said directing means.

5. A memory system as in claim 4 wherein said data transferring means comprises:
   a second SCSI bus having an end connected to said nonvolatile memory means;

a second SCSI controller connected to another end of said second SCSI bus and to said directing means.

6. A memory system as in claim 1 wherein said backup power source is a battery.

7. A memory system as in claim 1 wherein said directing means comprises a microprocessor.

8. A memory system as in claim 7 wherein said microprocessor comprises:
 a central processor unit connected to said transmitting, monitoring, and transferring means;
 a ROM memory connected to said central processor unit into which program may be stored.

9. An apparatus for switching a system from a main power source to a backup power source when said main power is interrupted to permit said system to perform an emergency operation using backup power, which operation includes emitting on a terminal of said system a signal indicating end of said operation, said apparatus comprising:
 an output terminal means attachable to said system;
 a main power terminal means attachable to said main source of power;
 a means for rectifying having one terminal connected to said main power terminal means and another terminal connected to said output terminal means, thereby permitting current to flow from said main power terminal means to said system but preventing current from flowing from said output terminal means to said main power terminal means;
 a backup terminal means adapted for connection to said backup power source;
 a backup power switch having a first terminal connected to said backup power terminal means, a second terminal connected to said output terminal, and a control terminal for opening and closing said backup power switch;
 a means for detecting interruption of main power having an input terminal connected to said main power, and a power interrupt terminal;
 a logic NAND having an input terminal connected to said interrupt signal terminal, another input terminal connected to said end of signal terminal, and an output terminal connected to said control terminal providing that when said main power is interrupted, a signal on said interrupt signal terminal will close said backup power switch permitting power to flow from said backup power source to said system which then performs said operation and emits an end-of-the-operation signal, thereby interrupting said power flowing to said system;
 a means of recharging said backup power source having an input terminal connected to said main power terminal means, an output charging terminal connected to said backup power terminal means, and a charging control terminal;
 a means for comparing two voltages having a first compare terminal connected to said main power terminal means, a second compare terminal connected to said backup power terminal means, and a signal terminal connected to said charging control terminal thereby providing that when voltage from said backup power source is less than a full charge voltage signal proportional to voltage from said main power source, a signal on said signal terminal will cause said charging means to pass charging current from said main power terminal means to said backup power terminal means.

* * * * *